(12) United States Patent
Zandonella Balco

(10) Patent No.: US 7,636,224 B2
(45) Date of Patent: Dec. 22, 2009

(54) METHOD AND SAFETY DEVICE FOR GROUND FAULT CIRCUIT

(75) Inventor: Sandro Zandonella Balco, Milan (IT)

(73) Assignee: Trinity S.A., D'Argent (LU)

(*) Notice: Subject to any disclaimer, the term of this patent is extended or adjusted under 35 U.S.C. 154(b) by 651 days.

(21) Appl. No.: 10/589,332

(22) PCT Filed: Apr. 19, 2004

(86) PCT No.: PCT/IT2004/000222

§ 371 (c)(1),
(2), (4) Date: Aug. 14, 2006

(87) PCT Pub. No.: WO2005/101605

PCT Pub. Date: Oct. 27, 2005

(65) Prior Publication Data

US 2007/0177325 A1     Aug. 2, 2007

(51) Int. Cl.
*H02H 3/00* (2006.01)
*H02H 9/08* (2006.01)
*G01R 31/18* (2006.01)
*G01R 27/02* (2006.01)

(52) U.S. Cl. .............................. 361/42; 361/43; 361/44; 361/45; 361/46; 361/47; 361/48; 361/49; 361/50; 361/79; 361/86; 361/87; 361/88; 324/607; 324/509; 324/523

(58) Field of Classification Search ................ None
See application file for complete search history.

(56) References Cited

U.S. PATENT DOCUMENTS

| 4,816,957 | A | 3/1989 | Irwin |
| 5,943,199 | A | 8/1999 | Aromin |
| 5,956,218 | A | 9/1999 | Berthold |
| 6,122,155 | A | 9/2000 | Aromin et al. |
| 6,262,871 | B1* | 7/2001 | Nemir et al. .................. 361/42 |
| 7,110,895 | B2* | 9/2006 | Takakamo et al. ............ 702/57 |
| 2003/0058590 | A1* | 3/2003 | Gershen et al. ............... 361/42 |
| 2004/0212935 | A1* | 10/2004 | Pierce et al. .................. 361/42 |

FOREIGN PATENT DOCUMENTS

GB       2 203 907       10/1988

* cited by examiner

*Primary Examiner*—Albert W Paladini
*Assistant Examiner*—Dharti Patel
(74) *Attorney, Agent, or Firm*—Wenderoth, Lind & Ponack, L.L.P.

(57) ABSTRACT

The invention refers to a method and an apparatus (1) for protecting people against leakage currents while using appliances such as home appliances or the like. The apparatus (1) is provided with a differential switch (20) normally open and a differential current transformer (39) which generates a signal proportional to the leakage current, an elaboration unit (50) interfaced with the latter acquires said signal and keeps the switch (20) closed until a dangerous condition is met, corresponding to an acquired signal having a magnitude greater than a limit value.

56 Claims, 4 Drawing Sheets

METHOD AND SAFETY DEVICE FOR GROUND FAULT CIRCUIT

The invention relates to a method for protecting against leakage currents and to a device for the implementation thereof It is known that when using devices supplied by the power network and likely to come into direct contact with a person, the risk of fulguration is always high; this is the reason why the safety standards dictate protective differential circuit breakers.

Usually, in a single phase system, an electrical device (i.e. generally speaking a load) is supplied by the public power network (also called mains) through two wires, one called "hot" or "phase", the other "neutral". Usually the public utility company near the distribution cabin grounds the neutral wire.

A common type of home injuries takes place when people use power network supplied devices while taking a bath or near a pool. The water becomes a path for a current, called leakage current or ground fault, flowing from the "hot" wire to ground; if this leakage current flows through a human body it can lead to fulguration.

The same happens when a person contacts the "hot" wire while touching or standing on a conductive surface to ground.

Commercial protection circuits for this kind of dangerous events, called Ground Fault Circuit Interrupter o GFCI, comprise a differential current transformer whose primary winding is formed by the hot and neutral wires, while the secondary winding is connected to an amplification stage. If the hot wire current reaches the load and returns through the neutral without leakage to ground, there is no magneto motive force in the core of said transformer to induce a secondary current.

On the contrary, if the current leaks, a current proportional to the difference between hot and neutral currents is generated in the secondary winding: this signal is amplified and then compared with proper safety thresholds and, on exceeding, a relay (or circuit breaker) trips disconnecting the hot and neutral wires from the load.

Since these devices protect the electrical system of a house as a whole, their sensibility is limited to 30 mA, not to take into account small parasitic leakage currents naturally flowing in a system.

When using electrical appliances or hand-tools in some conditions, i.e. in presence of humidity or in case of possible contact with water installations such as pipes or sanitary appliances, it should be advisable for safety reasons to rely on more sensitive protection circuits, able to be inserted in the plug connecting to the power network supply. In this case devices sensitive to currents down to 3 mA, or even less, can be realized.

The dangerous current level depends on sundry elements and standards for electromedical applications where electrodes are in contact with a patient request a threshold of 3 mA maximum for the protection circuit; nevertheless there can be danger for currents below 1 mA, if the protection circuit trip-time does not assure the current interruption before dangerous events can take place.

With such a high sensibility the protection circuit can assure the safety of the operator, but only if said circuit properly works. To permit a check that the circuit works properly conventional appliances in use at present are provided with a test button whose pressure lets a leakage current slightly greater than the circuit sensibility be simulated, thereby tripping the protection circuit. The burden of the check is however left to the user, who every time must connect the appliance to the mains, press the test-button and trigger the circuit again after tripping.

A protection system should not rely on manual intervention by the user, to assure the greatest reliability.

In the state of the art several solutions are disclosed.

U.S. Pat. No. 5,982,593 discloses a circuit breaker incorporating a ground fault protection: such protection is further provided with a test circuit for testing the safe working of the protection circuit itself; such test circuit is however enabled with a test-button.

U.S. Pat. No. 6,426,632 disclosese a system for generating current waveforms to test an arch fault protection and shortly describes the use of a microprocessor to detect the secondary current of a differential transformer and to compare it with thresholds stored in the microprocessor itself: if the detected current is greater than said thresholds the microprocessor sends a signal by which the relay is tripped and the connection with the mains is broken.

However, details are not given about how the microprocessor and the related circuits perform this function, and no reference is made to other functions performed by the microprocessor.

U.S. Pat. No. 5,875,087 refers to a circuit breaker for controlling the current flow from the mains to a load. A microprocessor is used to compare said current flow with performance parameters, stored and/or able to be stored inside said microprocessor, and to generate control signals for a circuit breaker. Said microprocessor performs a test of proper working only on the neighbouring circuits and not on the protection system as a whole; furthermore a calibration phase for the system does not exist.

U.S. Pat. No. 6,262,871 refers to an electronic circuit for automatically testing a GFCI; an important feature of this invention is that it must be coupled with an already realized GFCI or it must comprise the essential components thereof.

Cyclically, an artificial leakage current is produced by means of a microcontroller and the signal generated by the GFCI are investigated: if these signals are normal the test ends, otherwise the load controlled by the GFCI is isolated from the mains by tripping a second circuit breaker, necessarily to be added to the system.

The drawbacks of this solution are excessive circuital redundancy, since the GFCI is complicated by functions it should already have i.e. an automatic non-efficiency detection; furthermore, in order to define critical nodes of voltage sampling, to which it is not always so easy to access, causing on the other hand an increase of wiring and system costs, the GFCI circuit architecture on which this invention is applied is considered known a priori. In case of different circuit architectures, the system according to this invention must be completely re-designed.

Therefore, in the state of the art a GFCI does not exist that at the same time:

- does not need a manual intervention, being totally automatic;
- is highly sensitive to leakage currents;
- has a small size and is so compact to be inserted in any plug, socket or shunt element;
- comprises self-testing functions for its safe operation, either during an initialisation phase at power-on of the GFCI, or cyclically after powering the load;
- shows to the user the type of its malfunction;
- permits the power supply by the mains only after a check that the protection is properly and efficiently working;

through a calibration of the leakage current detection circuit, operates independently from the implementation of such detection circuit and is able to compensate drifts and offsets thereof;

upon detecting a dangerous leakage current disconnects the load from the mains and calls for a manual intervention of the user to re-establish the power supply.

It is a general object of the present invention to provide a GFCI comprising all the characteristics described thereinbefore.

Such object is reached when a GFCI is realized accordingly to the appended claims. All the advantages of a GFCI according to the present invention will anyway be more readily and clearly understood from the description of a preferred, although not sole embodiment, which is given below by mere way of non-limiting example with reference to the accompanying drawings, in which:

The invention is now described for a home appliance—i.e. a hair-dryer—but it is apparent for a man skilled in the art that the invention relates to other applications as well, such as to equip with a reliable GFCI a tool, a machine in a factory or any other electrical appliances.

In a particular embodiment, but this must not be regarded as a limitation to the invention, the GFCI is integrated in the plug at an end of the supply-cable of the hair-dryer. An equivalently advantageous solution may however be obtained by integrating the GFCI of the present invention in a wall-socket where the plug of the hair-dryer, or of another household electrical apparatus, is inserted in the socket.

Figure 1:
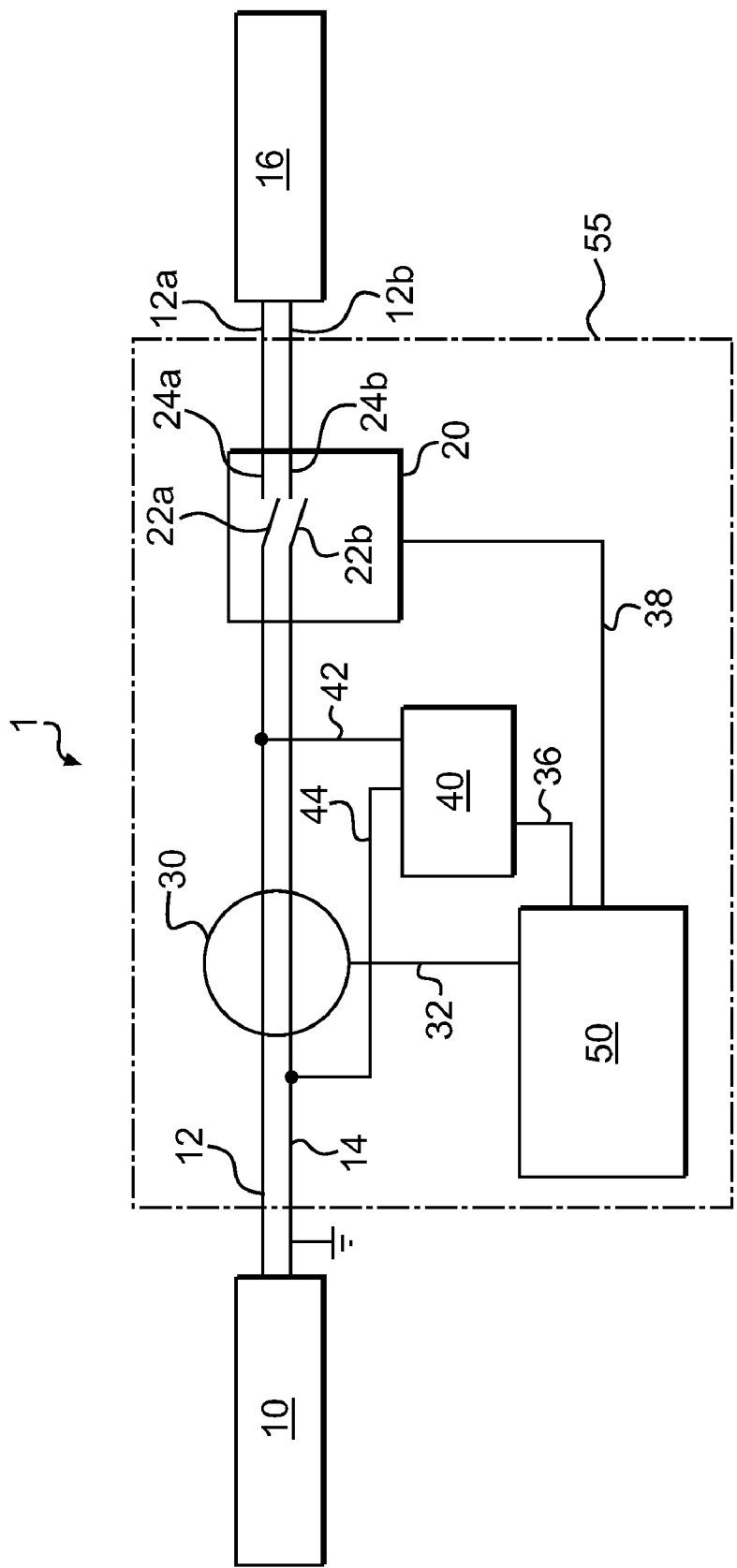
FIG. 1 shows a block diagram of a GFCI according to the present invention.

Referring to FIG. 1, where a block diagram of a GFCI 1 according to the present invention can be seen, the single-phase electrical power network or mains is indicated with 10; a hot wire 12 and a neutral wire 14, grounded, connect the network 10 to the separable contacts 22a, 22b of a relay 20. Other types of controlled switches (or circuit breakers) may be used, i.e. semiconductor devices. When the relay 20 is energized, said contacts 22a, 22b contact two terminals 24a, 24b, from which two conductors 12a, 12b are routed and connected to the terminals of a hair-dryer 16.

Conductors 12, 14 are comprised in a leakage current detection circuit in the conductors 12, 14 themselves, in this case a differential current transformer 30, realized on a toroidal core with known techniques. The primary winding of said transformer is obtained with conductors 12,14 while by means of another winding on the same toroid, schematically indicated with 32, a secondary is realized. For detecting direct leakage currents a current probe, for instance, or a LEM product may be used.

A test generator circuit 40 shunts said conductors 12, 14 by means of two conductors 42, 44. The function of the circuit 40, as it will be better explained thereinafter, is to artificially induce a precisely-known current flowing in conductors 42, 44, and hence in conductors 12, 14: since said current is a differential component for the transformer 30, it will detect said current thereby generating a secondary signal with an amplitude proportional thereto.

Figure 2:
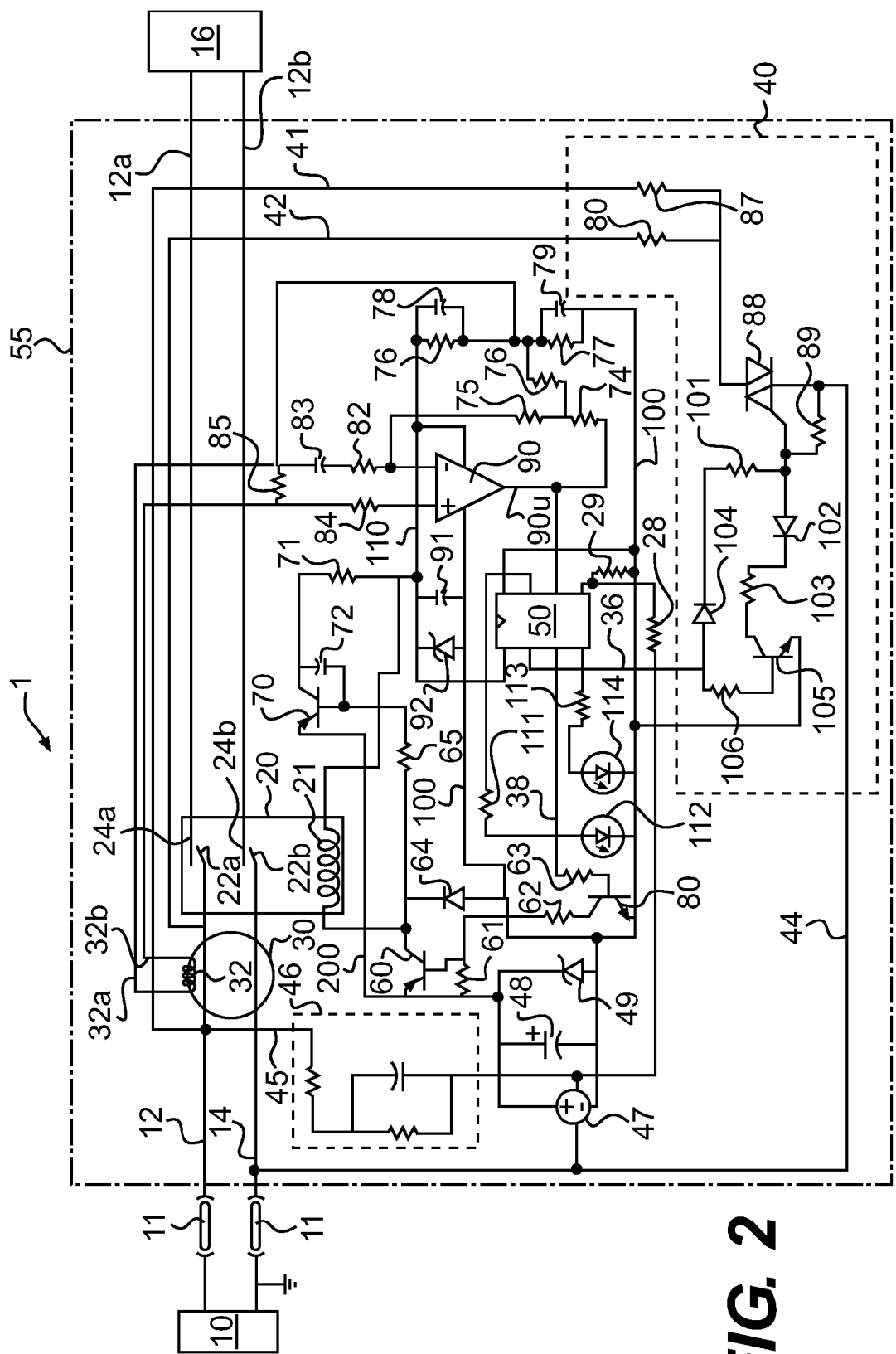
FIG. 2 shows a detailed schematic of the GFCI in FIG. 1.

This signal is acquired (or sampled) by a logic elaboration unit 50, to which the secondary 32 is interfaced via an amplification stage, as it will be clearer thereinafter; the logic elaboration unit 50 is also interfaced to the test generator circuit 40 and to the relay 20, to which it sends control and/or enabling signals through connections 36 and 38, respectively. Also, said unit 50 comprises al least an arithmetic module to perform binary operations, a RAM, a ROM and an A/D converter (all not shown). Referring to FIG. 2, the detailed schematic of GFCI 1 according to the present invention will be described; same references with corresponding parts in FIG. 1 are maintained.

In particular, the single phase power network 10 is connected via two fuses 11 to conductors 12 and 14, which reach the separable contacts 22a, 22b of the relay 20; when the coil 21 of relay 20 is energized, said contacts 22a, 22b contact two terminals 24a, 24b, from which two conductors 12a, 12b are routed and connected to the terminals of the hair-dryer 16.

The components of this embodiment of the present invention are advantageously housed inside a supply plug 55 of the hair-dryer 16, schematically shown in dashed lines in FIG. 2.

As can be seen from this figure, conductors 41, 42, connected to test generator circuit 40 (shown inside a dashed line), and a conductor 45 shunt conductors 12, 14 of the power network 10.

A drop resistive-capacitive network 46, shown inside dashed line, is connected to conductor 45 to reach a rectifying bridge 47 which is directly connected to the power network 10 via conductor 44. The output of said bridge 47 is filtered by an electrolytic capacitor 48 and levelled by a zener 49, in this embodiment to 30V. This voltage is a first power supply of GFCI 1. The positive terminal of capacitor 48 is connected, via a conductor 200, to the emitters of two PNP transistors 60, 70, while the negative terminal to a conductor 100 that constitutes the ground for the GFCI circuit 1, and with such a name—ground 100—it will be referred to. A resistor 61 is provided between the emitter and the base of transistor 60, whose base is connected through a limiting resistor 62 to the collector of a NPN transistor 80 having the emitter connected to ground 100 and the base connected, via a biasing resistor 63 and a conductor 38, to an output pin of the logic unit 50. As such a unit, for instance, a microcontroller Motorola MC908Q2 may be used. To the collector of transistor 60 the cathode of a free-wheeling diode 64, whose anode is connected to ground 100, a biasing resistor 65 for the base of transistor 70 and a terminal of the coil 21 of relay 20, are connected. The other terminal of coil 21 is routed to the parallel of a regulation zener 92 and a filtering capacitor 91, with negative terminals connected to ground 100 and the positive ones to a conductor 110 forming the positive of a second supply voltage (in this case 5.1V) feeding both the logic unit 50 and an operational amplifier 90 (for instance a LPV321). Said conductor 110 is reached, through a limiting resistor 71, by the collector current of transistor 70, to which a Miller capacitor 72 is applied.

The output 90u of the amplifier 90 is connected to both an input pin of the unit 50 and to star-connected feedback resistors 74, 75, 76; the series of the first two resistors is connected to the non-inverting pin of amplifier 90, while the third resistor couples the common node of resistors 74, 75 to a resistive divider shunting the second supply voltage of 5.1V.

This divider is formed by the series of two equal resistors 76, 77, to the common node of which a terminal of resistor 76 is connected. Two bypassing capacitors 78, 79 are provided in parallel, respectively, to resistors 76, 77.

To the inverting and non-inverting inputs of amplifier 90 there are connected, respectively, the series of a resistor 82 and a decoupling capacitor 83, and a resistor 84. These groups of components sense the voltage across a load resistor 85, connected in series to two conductors 32a, 32b coming from the secondary 32 of transformer 30. A terminal of the load resistor 85 is also connected to the divider output formed by resistors 76, 77.

Enclosed in a dashed line are grouped the following components of the test generator circuit 40. A high precision test resistor 86 connects to conductor 12 via conductor 42 the anode of a triac 88, whose cathode is connected to conductor 14 via conductor 44. Resistor 86 shunts conductor 12 at a node downstream transformer 30, in such a way that the current flowing in said resistor 86 returns to the network 10 through conductor 44 and 14 but without flowing through the toroidal core of transformer 30. Conductor 44, in fact, contacts conductor 12 upstream of the transformer 30. Since the current flowing in resistor 86 is only needed to be detected by transformer 30, other positions for the conductors are possible as well. In parallel to said resistor 86 there is provided another compensation resistor 87, which instead shunts conductor 12 via conductor 41 upstream transformer 30. Between the gate and the cathode of said triac 88 there is provided a resistor 89. To said gate there are connected the series of a resistor 101 and a diode 104 and the series of a resistor 103 and a diode 102, with its anode turned towards said gate. Said diodes 104 and 103 are in antiparallel. To resistor 103 there is connected the collector of a NPN transistor 105, with the emitter connected to ground 100, and base biased by a resistor 106 in turn fed by an output pin of unit 50. To this output pin is connected the anode of diode 104 as well, which is in series with resistor 101.

Two pins of the logic unit 50 feed two series resistor 111, 113—LED diode 112, 114, respectively. Through the driving of said LED diodes, the logic unit 50 is able to provide visual warnings or signals to the user of the GFCI 1. In order to highlight these warnings the LED diode 112 is green, the LED diode 114 red. Also, the use of acoustical warnings may be considered, such as buzzers or the like.

The series of two resistors 28, 29 form a divider, with an end connected to ground 100 and the other one in series with drop resistor 46, supplying a square-wave voltage with network 10 frequency to a pin of unit 50, that said unit 50 uses for internal timing by counting the line cycles (20 ms for 50 Hz mains and 16,66 ms for 60 Hz mains). Another source of internal timing may be a square-wave signal recovered from the clock of unit 50 and properly scaled down by divisors.

The phases of operation of the GFCI 1 are now described, from initialisation, when the user connects the plug 55 in the socket, to a steady condition, when he safely uses the hair-dryer 16. Said phases are:

I. The user inserts the plug 55 in the relative socket. The relay 20, normally open, is not energized so the hair-dryer 16 is not connected to the power network 10 and therefore it is not working. Via the diode bridge 47, capacitor 48 charges and the voltage across its terminals stabilizes once the breakdown voltage of zener 49 is reached. Transistor 60 is cut-off because it is not biased by transistor 80, also cut-off, since unit 50 does not bias the base thereof through resistor 63. Transistor 70, instead, is saturated owing to a current path for its base current through resistor 65, coil 21 of relay 20 and zener 92. This base current is too low to energize relay 20. Saturation of transistor 70 supplies, through resistor 71, zener 92, whose voltage, filtered by capacitor 91, supplies operational amplifier 90 and logic unit 50.

II. Since no current is flowing in the hair-dryer 16 and, therefore, in the primary winding of transformer 30, in its secondary no current flows and, as a consequence, there is no voltage across resistor 85. Therefore, the output 90u voltage of amplifier 90 maintains a steady value set by the divider formed by resistors 78, 79, at about half of its supply voltage. Unit 50 performs a sequential acquisition (sampling), through its internal A/D (8 bit, in this embodiment) converter, of the output 90u voltage of amplifier 90, averaging the samples with its internal arithmetic module on 65536 ($2^{16}$) acquisitions; this operation calls for less than a second to be performed. The averaged value must be 127, namely half of the full scale, with a deviation of three bits more or less to account for tolerances. Such value is obtained when the divider formed by resistors 76, 77 outputs a nominal voltage equal to half of the supply voltage. If the acquired value is outside this range, phase II is repeated from the beginning, otherwise next phase III is reached. In this phase, both LED diodes 122, 114 are on.

III. Unit 50 stores the averaged value obtained in phase II and samples amplifier 90 output voltage 90u for another 65536 times, calculating the average value thereof as in phase II. The obtained average value must be equal to the preceding one with a maximum 1 bit difference, otherwise the system jumps to phase II again. This guarantees that the second supply voltage is steady and that the A/D converter is properly working. The average value as calculated in this phase is stored inside the unit 50 and assumes the meaning of zero-reference value for the A/D converter. LED diodes 112, 114 remain on.

IV. The unit 50 enters the normal mode of acquiring amplifier 90 output voltage 90u: the absolute value of the difference between the sampled output voltage 90u of amplifier 90 and the zero-reference value stored in phase III, is calculated. From all these processed values the maximum value is stored and, after a delay of some network 10 cycles, unit 50 verifies that said maximum value is lower than 2, i.e. only the least significant bit is changed in the A/D conversion. This guarantees that the noise of the system is low enough not to interfere with the operation of GFCI 1; if this condition is not met, unit 50 jumps to phase I again. During this phase, both LED diodes 112, 114 flash.

V. Unit 50 biases with a positive voltage conductor 36, biasing transistor 105 with resistor 106 and saturating it. The gate of triac 88, through the series diode 104-resistor 101, is positively biased during the positive half-wave of network 10 voltage on conductor 12. During the negative half-wave, instead, the path for the bias current of triac 88 comprises diode 102, resistor 103 and transistor 105; in both cases a current flows through resistor 89 and the triac 88 is on.

VI. The on-state of triac 88 is maintained for two cycles of network 10 voltage: when the triac 88 is on, test resistor 86, whose value is very precise, produces a differential-current flow for transformer 30, which detects it and induces a current in the secondary 32, thereby generating a voltage across resistor 85. This AC voltage is amplified by operational amplifier 90 and provided at its output 90u. Unit 50 samples this voltage signal, as in the preceding phases, and converts it into a digital value by means of the internal A/D converter, storing the maximum value thereof. Then unit 50 verifies that said maximum value is comprised between an upper and lower threshold, both pre-stored in the ROM of unit 50. This for guarantying that the circuit for detecting differential currents as a whole is working and has an acceptable sensibility. If said maximum sampled value is too low, green diode LED 112 flashes for a short time and the system starts again from phase II. If said maximum sampled value is too high, red diode 114 flashes and, again, the system re-starts from phase II. If said maximum sampled value is acceptable, it is stored as test-value, imposed by the GFCI 1, and next phase VII is reached.

VII. Unit 50 now biases with positive voltage conductor 38, biasing with resistor 63 transistor 80, which saturates. A current now is able to flow from the first 30V supply to ground 100 through resistors 61,62, saturating transistor 60 and supplying the coil 21 of relay 20 from the first supply. Now in coil 21 a current can flow of enough magnitude to energize relay 20, which enables the hair-dryer 16 to be connected to network 10 thereby enabling its use. At the same time, unit 50 permanently switches green diode 112 on and switches red diode 114 off VIII. After energizing the relay 20 and thereby supplying the hair-dryer 16 from the network 10, unit 50 keeps on monitoring the output voltage 90u of operational amplifier 90, as in the previous phases. In particular, after converting into a digital number said output voltage 90u with the A/D converter, said unit 50 subtracts its maximum value to the zero-value, calculating then the module (or absolute value) thereof, obtaining the maximum value of the actual leakage current. If this maximum is greater than a limit-value, in this case the value stored at the end of phase VI, i.e. the test-value, for more than 10 consecutive times, i.e. for 10 acquisitions (made in about 0.1 ms), the unit 50 removes voltage from resistor 38, thereby tripping relay 20 and disconnecting hair-dryer 16 from network 10. The logic unit 50 signals the dangerous condition by flashing red LED diode 114. In this condition of danger the GFCI 1 stays locked, thereby preventing any further energizing of relay 20, and can be activated again only by switching it off and on again. This means, in this case, that the user must disconnect the plug 55 from the wall socket, remove the trouble causing the GFCI 1 to be tripped, and connect the plug 55 again. At that point GFCI 1 will begin working from described phase I.

During phase VIII, i.e. when the hair-dryer 16 is supplied, it is possible to perform cyclically test measures as in phases V and VI, to ascertain good working of the GFCI 1. In this case during the test—i.e. when the operations described in phases V and VI are performed—the acceptable maximum value at the operational 90 output 90u necessary for the relay 20 not to be tripped, i.e. the limit-value, is doubled, to guarantee anyway the user's safety.

According to what has been described, it is apparent that another advantage of the present invention is the ease with which the operating-threshold of the GFCI 1 can be set, i.e. by varying the value of the test-resistor 86. Being that threshold not a fixed value for comparison stored a priori in unit 50 but the result of a pre-set current that really must be detected by the GFCI 1 in the initialisation phase, the GFCI 1 assures a check even for an actually too low operating threshold for the GFCI 1. In that case, indeed, the load to be supplied would remain isolated.

Another advantage of the present invention is the ease with which it is possible to add other types of active protection, such as short-circuit or arch-fault protections, to the described protection.

A short-circuit condition takes place when conductors 12a and 12b in FIG. 2 contact, even temporally, or the load reaches very low impedance values, for example if a person touches conductors 12a and 12b: at this point a high current would flow through conductors 12a and 12b, being also lethal. Fuses 11 (see FIG. 2) do not guarantee a rapid tripping action.

Figure 3:
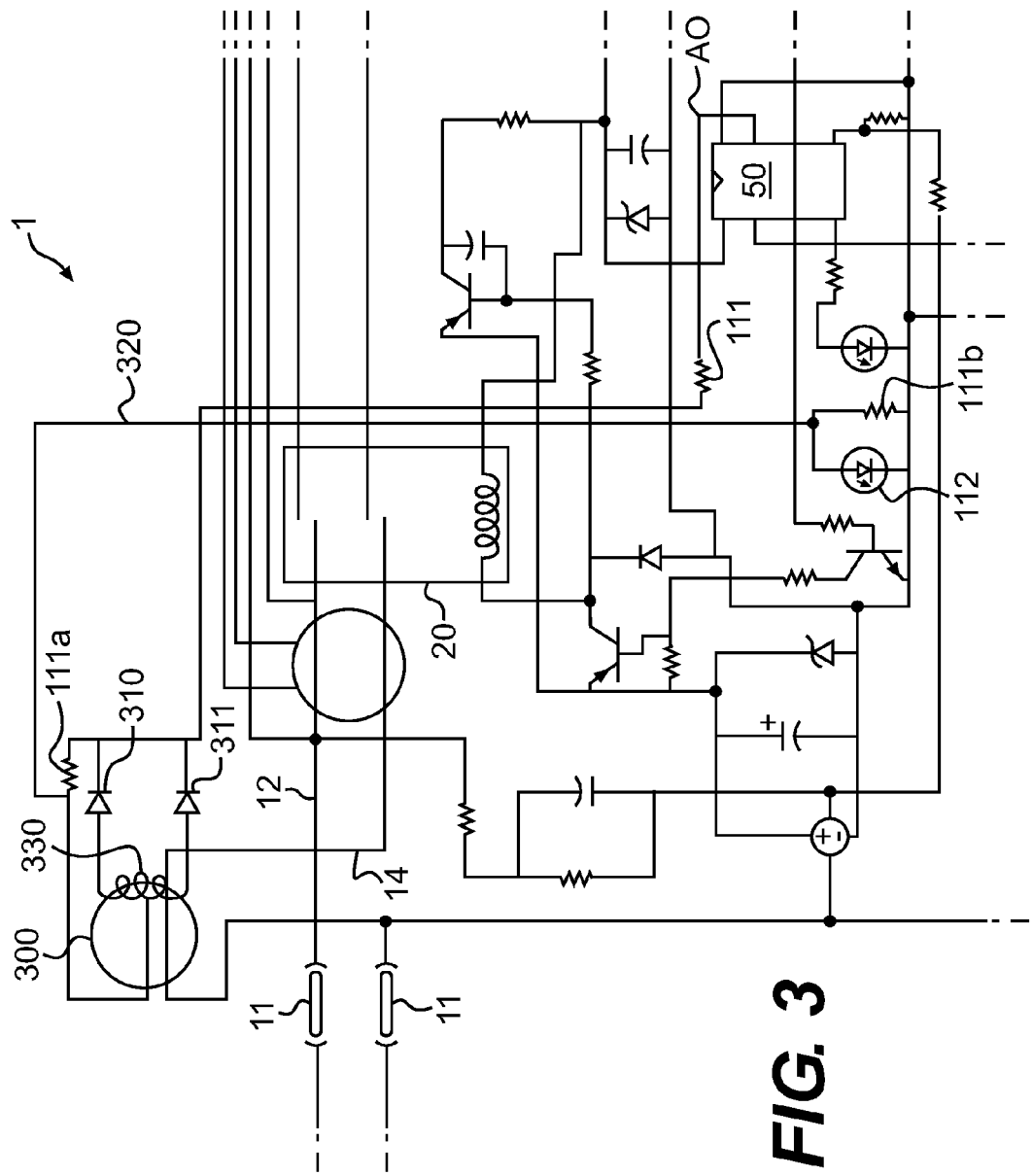
FIG. 3 shows a schematic for a variant of the circuit in FIG. 2.

This inconvenient may be overcome by realizing a variant of the present invention, shown in FIG. 3, where numerals relative to additional components are drafted, being the remaining part of the circuit equal to that described previously.

In this variant a protection against short circuit currents is added by inserting a current transformer 300 on conductor 14.

The insertion of transformer 300 can be performed on conductor 12 as well, or downstream of relay 20; the primary winding of such transformer 300 is the conductor 14 itself while the secondary, centered-tapped, is realized by means of a second winding 330. The center-tap is connected to the terminal of a very low value resistor 111a (a few ohm) to which, at the other terminal, are connected the anodes of two diodes 310, 311 whose cathodes are connected to the terminals of the secondary winding of transformer 300.

Resistor 111, which in FIG. 2 was shown connected directly to LED diode 112, now is connected to the node where the cathodes of diodes 310, 312 join; a conductor 320 connects the center-tap of secondary 330 of transformer 300 to LED diode 112, to which a resistor 111b having a relative high value (about 10 kΩ) is added in parallel. Therefore, it will be appreciated that the voltage at the secondary winding 330 of current transformer 300 is rectified by diodes 310 and 311, thus across resistor 111a a pulsing signal proportional to the current flowing into conductor 14 will be provided.

The operation of the circuit is the following.

The pin of unit 50 to which resistor 111 is connected—here defined A0—is used during initialisation as output pin and drives red LED diode 112 through resistor 111—as already described—and resistor 111a, while resistor 111b does not influence the operation of LED diode 112. At the end of the initialisation phases, red LED diode 112 is turned off and the A0 pin of unit 50 becomes an analogic input, thanks to proper instructions of the program contained in the unit 50.

Said A0 pin, then, is able to sample the voltage applied thereon, through the A/D converter, and consequently is able to measure indirectly the current fed to the load by means of the current transformer 300: unit 50 ensures the disconnection of the switch (relay) 20, in a similar manner to that already described, in case of a current flowing in conductor 14 exceeding a pre-established threshold, thereby guaranteeing a short-circuit protection.

Figure 4:
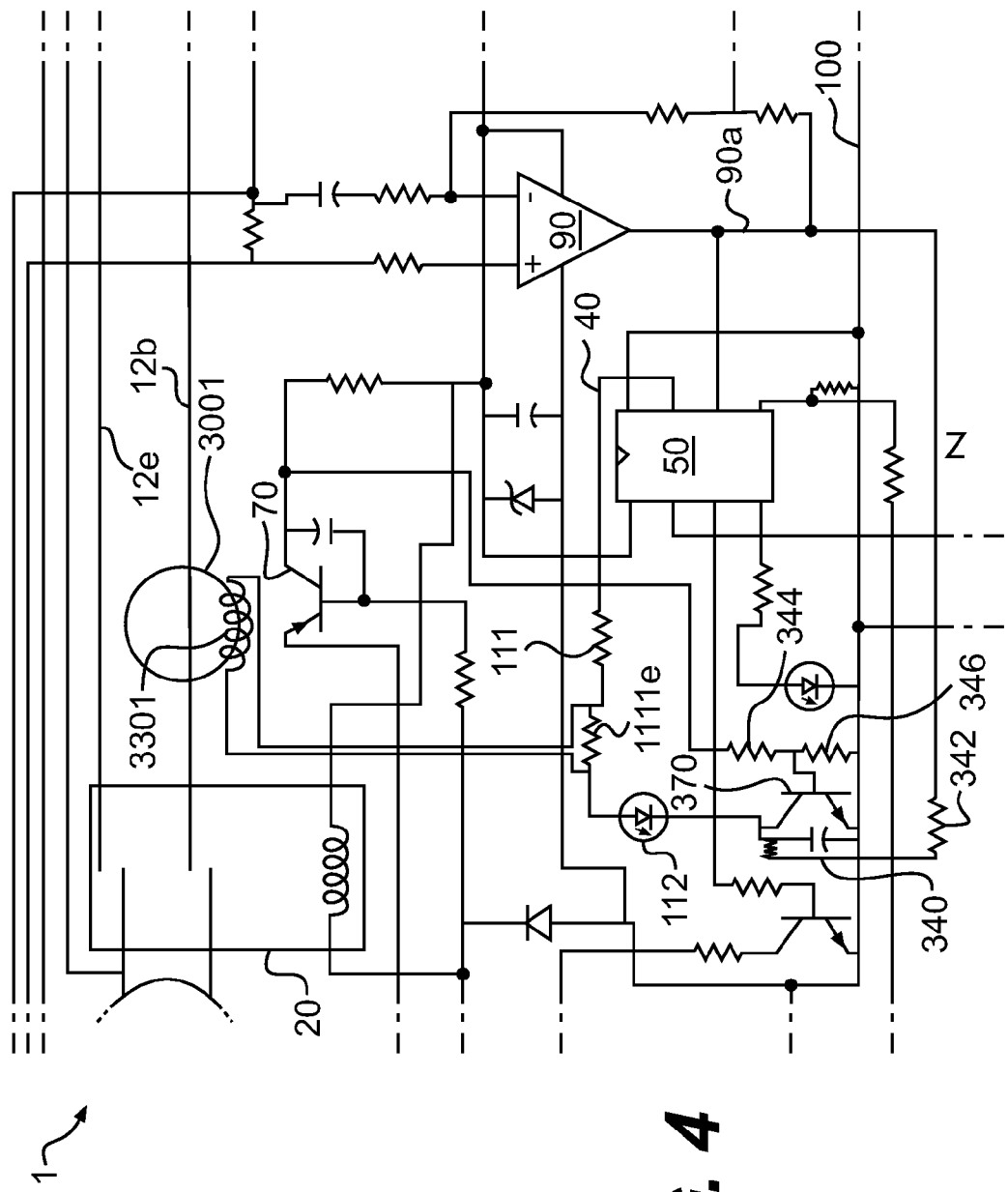
FIG. 4 shows a schematic for another variant of the circuit in FIG. 2

A second variant to the device according to the present invention is shown in FIG. 4 where, much the same as in the first variant, for sake of ease only new numerals are drafted, being the rest of the circuit the same as the one previously described.

On conductor 12b, connected to the load, a current transformer 3001, whose insertion may be performed on conductor 14b or upstream of (relay) switch 20 as well, is inserted; the primary winding of transformer 3001 is realized by means of conductor 12b, while the secondary is realized with a second winding 3301.

A very low value resistor 1111a (a few ohm) connects the terminals of the secondary winding 3301. Resistor 111, which in FIG. 2 was shown connected to LED diode 112, now is connected to resistor 1111a, which supplies the anode of LED diode 112. Its cathode is connected to the collector of a transistor 370, having its emitter connected to ground 100 and the base biased by a divider formed by two resistors 346, 344 and supplied by the collector of transistor 70. In parallel to said transistor 370 there is provided a capacitor 340, while the collector of transistor 370 is connected to the output 90u of operational amplifier 90 through a resistor 342.

The assembly consisting of resistor 342 and capacitor 340 forms a low-pass filter for the voltage at the output 90u of amplifier 90, thereby maintaining at the collector of transistor 370 a DC voltage equal to half of the second supply voltage.

The operation of the circuit is the following.

During initialisation phases, pin A0 of unit 50 is used as output pin and drives red LED diode 112, as already described, through resistor 111 and resistor 1111a, while transistor 370 is saturated (because transistor 70 is saturated as well and relay 20 is not energized and allows the turn-on of LED diode 112. At the end of the initialisation phases, red LED diode 112 turns off and pin A0 of unit 50 becomes an analogic input, thanks to proper program instructions.

At the same time transistor 370 cuts off and relay 20 is energized, owing to the cutting-off of transistor 70; then at the collector of transistor 370 there will be the DC component of the output 90u voltage of amplifier 90: this DC voltage, added to the signal generated by transformer 3001 across resistor 1111a, is sampled through the A/D converter, and consequently unit 50 can measure indirectly the current adsorbed by the load.

The reading of the voltage at pin A0 is carried out in the same way as the reading of the output 90u voltage of amplifier 90: the absolute value of the difference between the voltage at pin A0 and the zero-voltage (stored as zero-value during the above described phase IV) is compared with a limit-value stored in the ROM of unit 50 and, if greater, relay 20 is tripped thereby disconnecting the load 16.

It is understood that non-significant deviations from the protection method and the relative electronic circuit as expressed by the previous description and attached drawings are however comprised in the scope of the following claims.

The invention claimed is:

1. Method for the protection against leakage currents generated in the supply of a load (16) connected to an electrical network (10), comprising the phases of:
   (i) obtaining a zero-reference value by acquiring one or more times a signal (90u) proportional to the leakage current without generating test leakage currents;
   (ii) generating a test leakage current and acquiring a corresponding signal (90u) proportional thereto as test-value;
   (iii) detecting the actual leakage currents and generating a signal (90u) proportional thereto;
   (iv) acquiring a signal (90u) proportional to the actual leakage currents and disconnecting the load (16) from the electrical network (10) when reaching a dangerous condition corresponding to an acquired signal (90u) of a magnitude greater than a limit value.

2. Method according to claim 1, wherein the phases (i) and/or (ii) are performed before connecting the load (16) to the network (10).

3. Method according to claim 1, wherein the phases (i) and/or (ii) are performed verifying that such a signal (90u) be comprised in a pre-established range.

4. Method according to claim 1, further comprising the phase of cyclically verifying, after the connection of the load (16) to the network (10), the regular detection of leakage currents by generating al least a test current.

5. Method according to claim 1, wherein the limit value is obtained by taking the absolute value of the difference between the zero-reference value and the test-value.

6. Method according to claim 5, further comprising the phase of disconnecting the load (16) from the network (10) whenever, during the phase of cyclical verifying of the regular detection of leakage currents, the maximum in modulus of the magnitude of the acquired proportional signal (90u) is greater than the sum of the limit-value and the zero-reference value.

7. Method according to claim 1, further comprising the phase of detecting the current in at least a conductor connected to the load (16) and disconnecting the same load (16) whenever said current is greater than a pre-established threshold.

8. Method according to claim 7, wherein the phase of detecting the current in at least a conductor connected to the load (16) is performed before and/or after the connection of the load (16) to the network (10).

9. Method according to claim 1, wherein during a dangerous condition the load (16) is disconnected from the network (10) by means of a controlled switch (20) which is forced open until the same switch (20) is disconnected from the network (10).

10. Apparatus (1) for protection against leakage currents generated in the supply of a load (16) connected to an electrical network(10), comprising:
   an electrically controlled switch (20) set between the network (10) and the load (16), which disconnects the load (16) from the network (10) when open and connects it when closed;
   detecting means (30) for leakage currents that generate a signal proportional to the same leakage currents;
   a generator circuit (40) able to generate a test leakage current,
   an elaboration unit (50) connected with the detecting means (30) to acquire said proportional signal, with the generator circuit (40) for the control thereof, and with the switch (20) to drive its opening with a control signal (38) whenever a dangerous condition is met; characterized in that the elaboration unit (50) is adapted to perform at start-up an acquisition of a zero-reference value by reading the detecting means (30) without generating test leakage currents, to generate a test leakage current by driving the generator circuit (40) and to acquire a corresponding signal (90u) proportional thereto as test-value; then the elaboration unit (50) is further adapted to acquire a signal (90u) proportional to the actual leakage currents and to disconnect the load (16) from the electrical network (10) when reaching a dangerous condition corresponding to an acquired signal (90u) of a magnitude greater than a limit value.

11. Apparatus according to claim 10, further comprising a circuit generating a stabilized power supply for said elaboration unit (50), said circuit being supplied from the electrical network (10).

12. Apparatus according to claim 10, wherein the detecting means (30) for leakage currents comprise a differential transformer (30) having a core on which there are provided a primary winding constituted by conductors (12, 14) supplying the load (16), and a secondary winding (32) which generates a signal proportional to the current flowing into the primary winding.

13. Apparatus according to claim 10, wherein the generating circuit (40) comprises a resistor (86) in series with a triac (88) whose conduction is controlled by a signal (36) generated by the elaboration unit (50), said series shunting the conductors (12, 14) supplying the load (16) with a terminal downstream and a terminal upstream the detecting means (30).

14. Apparatus according to claim 10, wherein said elaboration unit (50) drives visual (112, 114) and/or acoustical warnings.

15. Apparatus according to claim 10, wherein said elaboration unit (50) is provided with timing means (28, 29) adapted to scan the cyclical control of the magnitude of the leakage current before and/or after the make of the switch (20).

16. Apparatus according to claim 10, wherein said elaboration unit (50) is provided with an arithmetic module adapted to compare the value acquired by the detecting means (30) for leakage currents with pre-established or acquired in real time values.

17. Apparatus according to claim 16, wherein said pre-established values are stored in a ROM inside the elaboration unit (50).

18. Apparatus according to claim 10, characterized in that it further comprises detecting means (300, 3001) for currents in al least a conductor connected to the load (16), said means (300, 3001) generating a signal proportional to said currents and being connected to said elaboration unit (50) to control the tripping of the switch (20) when a dangerous condition is met.

19. Electrical appliance provided with a plug (55) for connecting the appliance to an electrical network (10), characterized in that it comprises a protection apparatus (1) according to claim 10.

20. Appliance according to claim 19, being a hair-dryer or any other household electrical apparatus.

21. Socket for supplying electrical appliances, comprising a protection apparatus (1) according to claim 10.

22. Method according to claim 2, wherein the phases (i) and/or (ii) are performed verifying that such a signal (90u) be comprised in a pre-established range.

23. Method according to claim 2, further comprising the phase of cyclically verifying, after the connection of the load (16) to the network (10), the regular detection of leakage currents by generating al least a test current.

24. Method according to claim 3, further comprising the phase of cyclically verifying, after the connection of the load (16) to the network (10), the regular detection of leakage currents by generating al least a test current.

25. Method according to claim 22, further comprising the phase of cyclically verifying, after the connection of the load (16) to the network (10), the regular detection of leakage currents by generating al least a test current.

26. Method according to claim 2, wherein the limit value is obtained by taking the absolute value of the difference between the zero-reference value and the test-value.

27. Method according to claim 3, wherein the limit value is obtained by taking the absolute value of the difference between the zero-reference value and the test-value.

28. Method according to claim 22, wherein the limit value is obtained by taking the absolute value of the difference between the zero-reference value and the test-value.

29. Method according to claim 26, further comprising the phase of disconnecting the load (16) from the network (10) whenever, during the phase of cyclical verifying of the regular detection of leakage currents, the maximum in modulus of the magnitude of the acquired proportional signal (90u) is greater than the sum of the limit-value and the zero-reference value.

30. Method according to claim 27, further comprising the phase of disconnecting the load (16) from the network (10) whenever, during the phase of cyclical verifying of the regular detection of leakage currents, the maximum in modulus of the magnitude of the acquired proportional signal (90u) is greater than the sum of the limit-value and the zero-reference value.

31. Method according to claim 28, further comprising the phase of disconnecting the load (16) from the network (10) whenever, during the phase of cyclical verifying of the regular detection of leakage currents, the maximum in modulus of the magnitude of the acquired proportional signal (90u) is greater than the sum of the limit-value and the zero-reference value.

32. Method according to claim 2, wherein during a dangerous condition the load (16) is disconnected from the network (10) by means of a controlled switch (20) which is forced open until the same switch (20) is disconnected from the network (10).

33. Electrical appliance provided with a plug (55) for connecting the appliance to an electrical network (10), characterized in that it comprises a protection apparatus (1) according to claim 11.

34. Electrical appliance provided with a plug (55) for connecting the appliance to an electrical network (10), characterized in that it comprises a protection apparatus (1) according to claim 12.

35. Electrical appliance provided with a plug (55) for connecting the appliance to an electrical network (10), characterized in that it comprises a protection apparatus (1) according to claim 13.

36. Electrical appliance provided with a plug (55) for connecting the appliance to an electrical network (10), characterized in that it comprises a protection apparatus (1) according to claim 14.

37. Electrical appliance provided with a plug (55) for connecting the appliance to an electrical network (10), characterized in that it comprises a protection apparatus (1) according to claim 15.

38. Electrical appliance provided with a plug (55) for connecting the appliance to an electrical network (10), characterized in that it comprises a protection apparatus (1) according to claim 16.

39. Electrical appliance provided with a plug (55) for connecting the appliance to an electrical network (10), characterized in that it comprises a protection apparatus (1) according to claim 17.

40. Electrical appliance provided with a plug (55) for connecting the appliance to an electrical network (10), characterized in that it comprises a protection apparatus (1) according to claim 18.

41. Appliance according to claim 33, being a hair-dryer or any other household electrical apparatus.

42. Appliance according to claim 34, being a hair-dryer or any other household electrical apparatus.

43. Appliance according to claim 35, being a hair-dryer or any other household electrical apparatus.

44. Appliance according to claim 36, being a hair-dryer or any other household electrical apparatus.

45. Appliance according to claim 37, being a hair-dryer or any other household electrical apparatus.

46. Appliance according to claim 38, being a hair-dryer or any other household electrical apparatus.

47. Appliance according to claim 39, being a hair-dryer or any other household electrical apparatus.

48. Appliance according to claim 40, being a hair-dryer or any other household electrical apparatus.

49. Socket for supplying electrical appliances, comprising a protection apparatus (1) according to claim 11.

50. Socket for supplying electrical appliances, comprising a protection apparatus (1) according to claim 12.

51. Socket for supplying electrical appliances, comprising a protection apparatus (1) according to claim 13.

52. Socket for supplying electrical appliances, comprising a protection apparatus (1) according to claim 14.

53. Socket for supplying electrical appliances, comprising a protection apparatus (1) according to claim 15.

54. Socket for supplying electrical appliances, comprising a protection apparatus (1) according to claim 16.

55. Socket for supplying electrical appliances, comprising a protection apparatus (1) according to claim 17.

56. Socket for supplying electrical appliances, comprising a protection apparatus (1) according to claim 18.

* * * * *